United States Patent
Okami

(10) Patent No.: US 11,261,520 B2
(45) Date of Patent: Mar. 1, 2022

(54) ROLL-TO-ROLL SURFACE TREATMENT DEVICE, AND FILM DEPOSITION METHOD AND FILM DEPOSITION DEVICE USING SAME

(71) Applicant: SUMITOMO METAL MINING CO., LTD., Tokyo (JP)

(72) Inventor: Hideharu Okami, Niihama (JP)

(73) Assignee: SUMITOMO METAL MINING CO., LTD., Tokyo (JP)

(*) Notice: Subject to any disclaimer, the term of this patent is extended or adjusted under 35 U.S.C. 154(b) by 61 days.

(21) Appl. No.: 16/327,264

(22) PCT Filed: Aug. 23, 2017

(86) PCT No.: PCT/JP2017/030065
§ 371 (c)(1),
(2) Date: Apr. 9, 2019

(87) PCT Pub. No.: WO2018/038141
PCT Pub. Date: Mar. 1, 2018

(65) Prior Publication Data
US 2019/0226080 A1    Jul. 25, 2019

(30) Foreign Application Priority Data

Aug. 23, 2016  (JP) .............................. JP2016-162787

(51) Int. Cl.
| | |
|---|---|
| *C23C 14/56* | (2006.01) |
| *H05K 3/16* | (2006.01) |
| *H05K 3/00* | (2006.01) |
| *C23C 16/54* | (2006.01) |
| *C23C 14/34* | (2006.01) |

(52) U.S. Cl.
CPC ............ *C23C 14/562* (2013.01); *C23C 14/34* (2013.01); *C23C 14/56* (2013.01); *C23C 16/54* (2013.01);
(Continued)

(58) Field of Classification Search
CPC ....... C23C 14/205; C23C 14/34; C23C 14/50; C23C 14/541; C23C 14/562;
(Continued)

(56) References Cited

U.S. PATENT DOCUMENTS

| | | | |
|---|---|---|---|
| 3,414,048 A | 12/1968 | Rall | |
| 2013/0149555 A1* | 6/2013 | Yamazaki | ................ C08J 7/044 |
| | | | 428/697 |

FOREIGN PATENT DOCUMENTS

| | | |
|---|---|---|
| JP | S62-247073 A | 10/1987 |
| JP | H02-98994 A | 4/1990 |

(Continued)

OTHER PUBLICATIONS

Machine Translation 2012-026025. (Year: 2012).*
(Continued)

*Primary Examiner* — Rodney G McDonald
(74) *Attorney, Agent, or Firm* — Locke Lord LLP; James E. Armstrong, IV; Nicholas J. DiCeglie, Jr.

(57) ABSTRACT

Disclosed herein is a roll-to-roll long base material surface processing device capable of performing surface processing on a long base material with little occurrence of wrinkling in the long base material at low costs. The surface processing device includes: two can rolls that cool a long resin film transferred in a roll-to-roll manner in a vacuum chamber with a cooling medium circulated therein by wrapping the long resin film around outer circumferences thereof; and surface processing units typified by magnetron sputtering cathodes provided so as to face the outer circumferences of the two can rolls, wherein a second can roll of the two can rolls other than a most upstream first can roll has a gas release mechanism that releases a gas from the outer circumference.

12 Claims, 2 Drawing Sheets

(52) U.S. Cl.
CPC ................. *H05K 3/00* (2013.01); *H05K 3/16* (2013.01); *H05K 2203/085* (2013.01); *H05K 2203/1545* (2013.01)

(58) Field of Classification Search
CPC .......... C23C 14/564; H05K 3/00; H05K 3/16; H05K 2203/085; H05K 2203/1545
USPC ..................................... 204/298.24; 118/718
See application file for complete search history.

(56) References Cited

FOREIGN PATENT DOCUMENTS

| | | |
|---|---|---|
| JP | 3447070 B2 | 9/2003 |
| JP | 2009-224444 A | 10/2009 |
| JP | 2012-026025 A | 2/2012 |
| JP | 2013-049914 A | 3/2013 |
| JP | 2013-049915 A | 3/2013 |
| JP | 2013-049916 A | 3/2013 |
| JP | 2014-234541 A | 12/2014 |
| JP | 2015-209552 A | 11/2015 |
| WO | 2005/001157 A2 | 1/2005 |

OTHER PUBLICATIONS

Machine Translation 2015-209552 (Year: 2015).*
Machine Translation 2014-234541 (Year: 2014).*
International Search Report dated Oct. 10, 2017, issued for PCT/JP2017/030065.

* cited by examiner

[Fig.1]
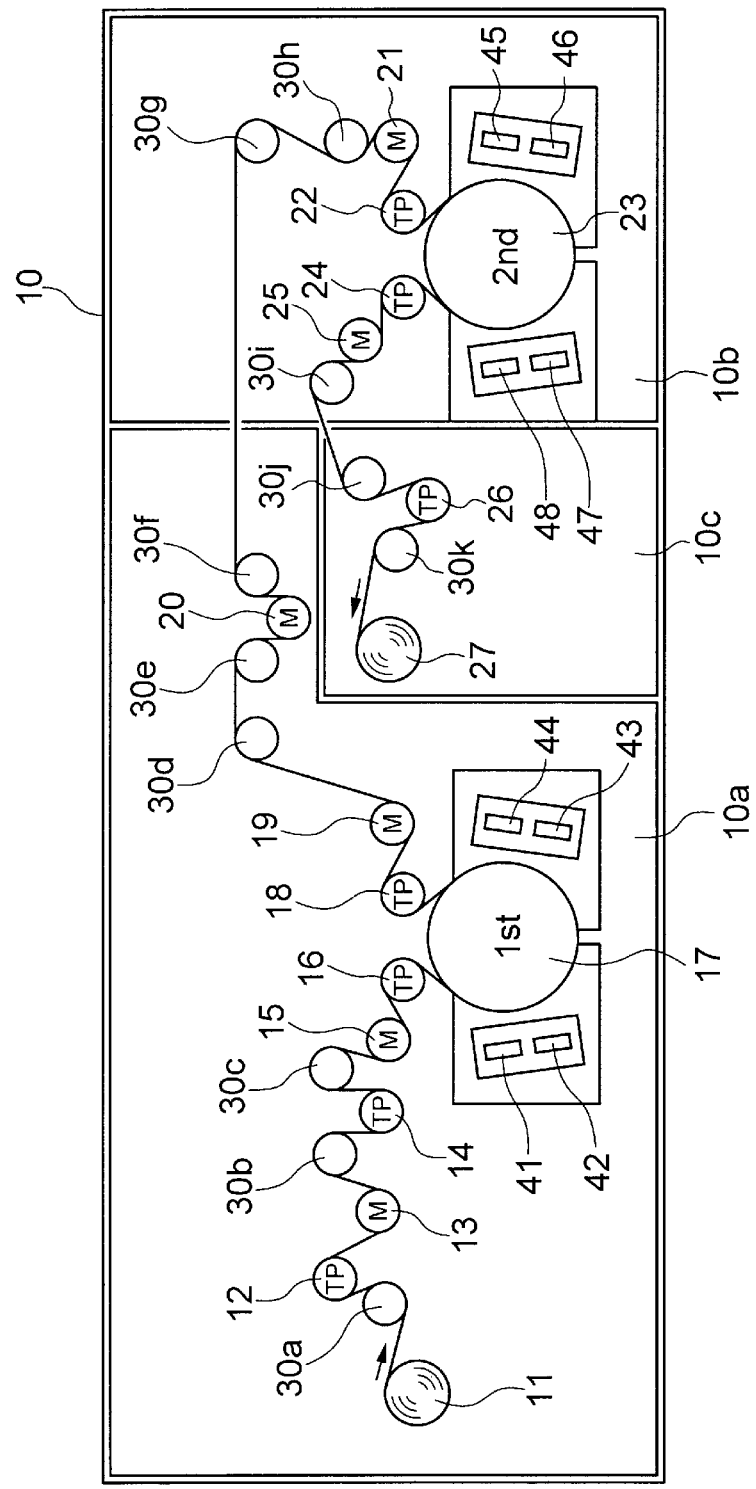

[Fig.2]
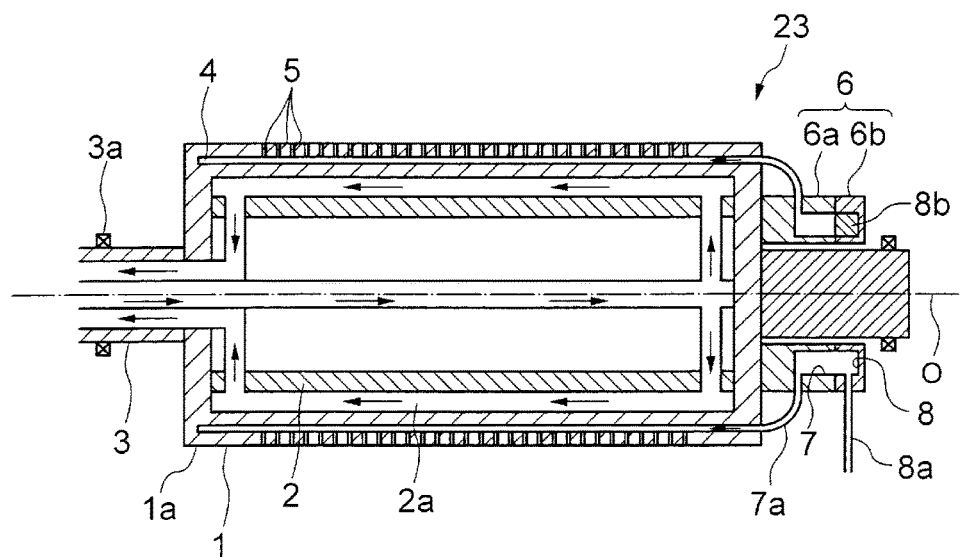
[Fig.3]
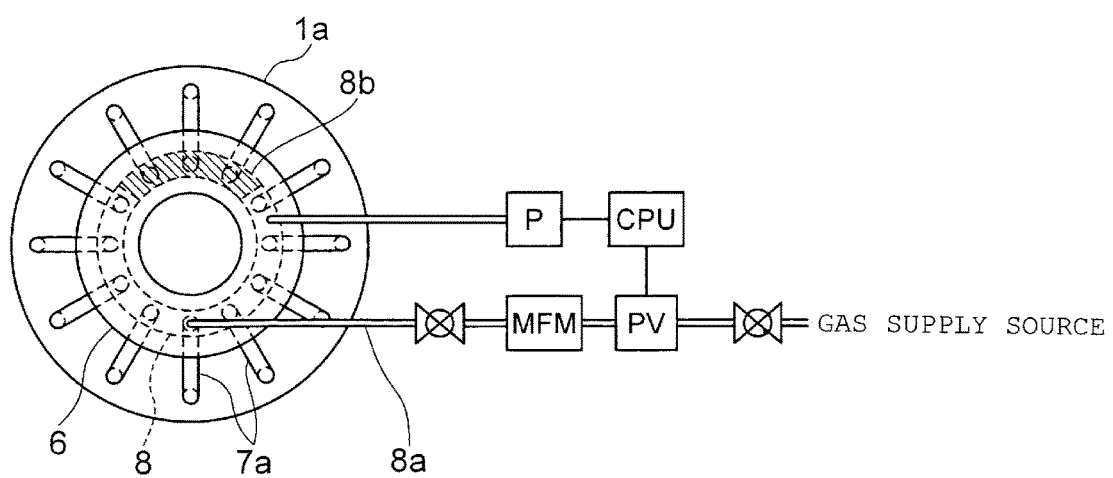

ROLL-TO-ROLL SURFACE TREATMENT DEVICE, AND FILM DEPOSITION METHOD AND FILM DEPOSITION DEVICE USING SAME

TECHNICAL FIELD

The present invention relates to a roll-to-roll surface processing device having at least two can rolls that cool a long base material transferred in a roll-to-roll manner in a vacuum chamber during surface processing by wrapping the long base material around the outer circumferences thereof, a film deposition method using the roll-to-roll surface processing device, and a film deposition device using the roll-to-roll surface processing device.

BACKGROUND ART

In an electronic device such as a liquid crystal panel, a notebook computer, a digital camera, or a mobile phone, a flexible wiring substrate is used which has a resin film and a wire circuit formed on the resin film. This flexible wiring substrate can be produced by patterning a metal film of a metallized resin film, which is obtained by forming a metal film on one or both of surfaces of a resin film, by thin-film technology such as photolithography or etching. In recent years, wire circuit patterns of flexible wiring substrates have been increasingly miniaturized and densified, and therefore there has been demand for flat and wrinkle-free metallized resin films.

As methods for producing such a metallized resin film, for example, the following methods are known: a method in which metal foils are bonded to a resin film with an adhesive (method for producing a three-layer substrate); a method in which a metal foil is coated with a resin solution and then the resin solution is dried (casting method); and a method in which a metal film is formed on a resin film by a vacuum film deposition method alone or a combination of a vacuum film deposition method and a wet plating method (metallization method).

Among the above production methods, examples of the vacuum film deposition method used for metallization include a vacuum deposition method, a sputtering method, an ion plating method, and an ion beam sputtering method. For example, as a sputtering method, Patent Literature 1 discloses a method in which a chromium layer is sputtered on a polyimide insulating layer, and then a conductive layer is formed by sputtering copper. Further, Patent Literature 2 discloses a material for flexible circuit board in which a first metal thin film formed by sputtering using a copper-nickel alloy as a target and a second metal thin film formed by sputtering using copper as a target are laminated in this order on a polyimide film.

When a metallized resin film is produced by deposition of a metal film on a resin film such as a polyimide film by the above-described vacuum film deposition method, a vacuum film deposition device is generally used in which a metal film is efficiently formed on a long resin film in a vacuum while the long resin film is continuously transferred in a roll-to-roll manner. When a metal film is formed by sputtering using such a vacuum film deposition device, a metal film formed by sputtering usually has excellent adhesive strength, but there is a case where a resin film is wrinkled during film deposition because a higher thermal load is applied to the resin film by sputtering than by vacuum deposition. Therefore, a sputtering web coater is used as the vacuum film deposition device in which a metal film is continuously formed in a vacuum on a long resin film cooled by being wrapped around the outer circumference of a can roll provided on a resin film transfer path while the long resin film is transferred in a roll-to-roll manner from an unwinding roll to a winding roll in a vacuum chamber.

For example, Patent literature 3 discloses a roll-to-roll vacuum sputtering device as an example of the sputtering web coater. This roll-to-roll vacuum sputtering device has a cooling roll that plays the role of a can roll, and further has a sub roll provided at least upstream or downstream from the cooling roll to control a long resin film so that the long resin film comes into close contact with the cooling roll.

However, as described in Non-Patent Literature 1, the outer circumference of the can roll is not flat at the micro level. Therefore, the outer circumference of the can roll and the long resin film that is in contact with the can roll during transfer are separated from each other with a vacuum space being interposed between them as a gap. For this reason, there is a case where the heat of the long resin film generated during film deposition is not efficiently transferred to the can roll, which causes wrinkles in the long resin film.

In order to solve such a problem, a technique has been proposed in which a gas is released from the outer circumference of the can roll of the sputtering web coater to increase the heat conductivity of the gap between the outer circumference and the long resin film as compared with that of a vacuum. For example, Patent Literature 4 discloses a technique in which a plurality of micro holes are provided in the outer circumference of a can roll as gas release holes, and Patent Literature 5 discloses a technique in which grooves are provided in the outer circumference of a can roll as gas release holes. Further a method is also known in which a can roll itself is made of a porous material to use micro pores of the porous material itself as gas release holes.

According to Non-Patent Literature 2, when argon gas is released at a pressure of 500 Pa, the heat conductance of the gap between the outer circumference of a can roll and a resin film is 250 $(W/m^2 \cdot K)$ in a molecular flow region in which the distance between the outer circumference of the can roll and the resin film is about 40 µm or less. In the molecular flow region, when a larger number of gas molecules are present in the gap, that is, when the pressure of the gas is higher, the efficiency of heat transfer by the molecular flow of the gas is higher.

When film deposition is performed on both surfaces of a long resin film by using the above-described sputtering web coater, a metal film is first formed on only one of the surfaces of the long resin film by transferring the long resin film in one direction from the unwinding roll to the winding roll, the long resin film having a metal film formed on only one surface thereof is then removed from the winding roll and set on the unwinding roll, and a metal film is formed on the other surface of the long resin film by again transferring the long resin film in one direction from the unwinding roll to the winding roll.

However, this method is poor in production efficiency because the vacuum chamber needs to be once exposed to the atmosphere after a metal film is formed on one surface of the long resin film. Therefore, Patent Literatures 6, 7, and 8 propose to perform film deposition using a film deposition device having two can rolls, which allows continuous film deposition on both front and back surfaces of a resin film only by transferring the resin film once in one direction from an unwinding roll to a winding roll.

CITATION LIST

Patent Literature

Patent Literature 1: JP 2-98994 A
Patent Literature 2: Japanese Patent No. 3447070
Patent Literature 3: JP 62-247073 A
Patent Literature 4: WO 2005/001157
Patent Literature 5: U.S. Pat. No. 3,414,048
Patent Literature 6: JP 2013-049914 A
Patent Literature 7: JP 2013-049915 A
Patent Literature 8: JP 2013-049916 A Non-Patent Literature Non-Patent Literature 1: "Vacuum Heat Transfer Models for Web Substrates: Review of Theory and Experimental Heat Transfer Data," 2000 Society of Vacuum Coaters, 43rd. Annual Technical Conference Proceeding, Denver, Apr. 15-20, 2000, p. 335
Non-Patent Literature 2: "Improvement of Web Condition by the Deposition Drum Design," 2000 Society of Vacuum Coaters, 50th. Annual Technical Conference Proceeding (2007), p. 749

SUMMARY OF INVENTION

Technical Problem

When a long resin film is transferred using the above-described so-called gas release mechanism-equipped can roll having gas release holes provided in the outer circumference thereof such as one shown in Patent Literature 4 or 5, a normal force pressing the long resin film against the outer circumference of the can roll against the pressure of a gas released into the gap is determined by dividing the tension of the long resin film in a transfer direction by the radius of the can roll.

When the gas pressure in the gap is adjusted so as not to exceed the normal force, the gap between the outer circumference of the can roll and the long resin film can be reduced to almost 0, and recesses in the outer circumference having micro surface irregularities are filled with the gas so that the long resin film mainly comes in contact with projections of the surface irregularities. If the gas pressure in the gap exceeds the normal force, the gap increases so that the gas starts to leak from both the width-direction edges of the long resin film. In this case, the gas pressure increases only up to a certain level due to leakage.

As described above, the gas release mechanism-equipped can roll has a complicated structure and is therefore costly, and further the gas pressure in the gap needs to be adjusted to stably wrap the long resin film around the outer circumference of the can roll. Therefore, use of the gas release mechanism-equipped can rolls for all the can rolls of the sputtering web coater having at least two can rolls leads to a problem of higher cost.

In view of the above-described conventional problem, it is an object of the present invention to provide a roll-to-roll long base material surface processing device that has at least two can rolls so that both surfaces of a long base material can be processed with very few wrinkles at low costs by transferring the long base material in a roll-to-roll manner only in one direction, and a long base material surface processing method using the same.

Solution to Problem

In order to achieve the above object, the present inventor has intensively studied, and as a result, has found that a long resin film before film deposition slightly contains moisture even when having been subjected to dry treatment, and therefore when film deposition is performed on one of the surfaces of the long resin film and then on the other surface using two can rolls, moisture or the like may be released from the long resin film due to a thermal load applied by sputtering or the like when a film is formed on a first surface, that is, the above-described gap is not in a completely vacuum state, and molecules that contribute to heat conduction are present even when the gas release mechanism-equipped can roll is not used. However, when a film is formed on a second surface, the gap is almost in a completely vacuum state because a film has already been formed on the surface of the long resin film that is in contact with the outer circumference of the can roll, and therefore a gas is not released from the long resin film into the gap.

The present inventor has found that when film deposition is performed on both surfaces of a long resin film transferred only in one direction in a roll-to-roll manner in a vacuum chamber with the use of a vacuum film deposition device having at least two can rolls that cool the long resin film by wrapping the long resin film around the outer circumferences thereof, the occurrence of wrinkling can be effectively reduced at low costs by using the gas release mechanism-equipped can roll not as the can roll provided most upstream to form a film on the first surface but as the can roll provided downstream to form a film on the second surface. This finding has led to the completion of the present invention.

That is, the present invention is directed to a roll-to-roll surface processing device including: at least two can rolls that cool a long base material transferred in a roll-to-roll manner in a vacuum chamber with a cooling medium circulating therein by wrapping the long base material around outer circumferences thereof; and surface processing units provided so as to face the outer circumferences of the can rolls, wherein at least one of the at least two can rolls other than the can roll provided most upstream has a gas release mechanism that releases a gas from the outer circumference.

Advantageous Effects of Invention

According to the present invention, it is possible to perform surface processing, which involves application of a thermal load, on both surfaces of a long base material with very few wrinkles only by transferring the long base material in a roll-to-roll manner in one direction.

BRIEF DESCRIPTION OF DRAWINGS

FIG. 1 is a front view of a roll-to-roll vacuum film deposition device as a specific example of the present invention.
FIG. 2 is a cross-sectional view of a gas release mechanism-equipped can roll of the vacuum film deposition device shown in FIG. 1.
FIG. 3 is a process flow diagram showing a specific example of a gas supply system of a gas rotary joint of the can roll shown in FIG. 2.

DESCRIPTION OF EMBODIMENTS

Hereinbelow, referring to FIG. 1, a vacuum film deposition device that continuously performs dry film deposition on a long base material will be described as a specific example of a roll-to-roll long base material surface processing device according to the present invention. The vacuum film deposition device shown in FIG. 1 is a film deposition device that is also called a sputtering web coater and that can continuously perform sputtering film deposition processing, which involves the application of a thermal load, on the surfaces of a long resin film F as a long base material transferred in a roll-to-roll manner in a vacuum chamber 10 while the long resin film F is cooled from the back surface side thereof by being wrapped around the outer circumferences of two can rolls.

The vacuum chamber 10 is divided by a partition into a first film deposition chamber 10a in which film deposition is performed on a first surface of the long resin film F, a second film deposition chamber 10b in which film deposition is performed on a second surface, and a winding chamber 10c in which the long resin film F is wound up after film deposition. The partition has slits through which the long resin film F passes. In the first film deposition chamber 10a and the second film deposition chamber 10b, various vacuum devices (not shown) such as dry pumps, turbomolecular pumps, and cryogenic coils are provided so that the pressure of an atmosphere can be reduced to about $10^{-4}$ Pa for sputtering film deposition and then can be adjusted to about 0.1 to 10 Pa by introducing a sputtering gas. As the sputtering gas, a known gas such as argon is used, and a gas such as oxygen is further added depending on the purpose. The shape and material of the vacuum chamber 10 are not particularly limited as long as the vacuum chamber 10 can withstand the above-described decompressed state.

In this vacuum chamber 10, various roll groups that define a roll-to-roll transfer path of the long resin film F and film deposition units that perform film deposition processing on the long resin film F are provided. These various roll groups include a pair of an unwinding roll 11 and a winding roll 27, motor-driven first can roll 17 (indicated as 1st) and second can roll 23 (indicated as 2nd) around which the long resin film F unwound from the unwinding roll 11 is to be wrapped for cooling, tension sensor rolls (indicated as TP), motor-driven rolls (indicated as M), and other free rolls.

The roll-to-roll transfer path defined by the various roll groups will be specifically described. The first film deposition chamber 10a includes part of the roll-to-roll transfer path from the unwinding roll 11 to the winding roll 27, and the long resin film F unwound from the unwinding roll 11 is passed through a free roll 30a, a first tension sensor roll 12, a first driving roll 13, a free roll 30b, a second tension sensor roll 14, a free roll 30c, a first feeding roll 15, and a first feeding tension sensor roll 16 in this order and fed to the first can roll 17. The long resin film F is subjected to film deposition processing by the film deposition unit while being transferred counterclockwise along the outer circumference of the first can roll 17, and is then sent from the outer circumference of the first can roll 17 by a first sending roll 19 through a first sending tension sensor roll 18.

The first tension sensor roll 12 measures the tension of the long resin film F just after unwinding from the unwinding roll 11. On the basis of this measured value, AC servomotors of the unwinding roll 11 and the first driving roll 13, which are respectively located just upstream and downstream from the first tension sensor roll 12, are subjected to, for example, torque control or speed control. In this way, the tension of the long resin film F is maintained at a predetermined preset value.

Further, the first feeding tension sensor roll 16 provided just upstream from the first can roll 17 measures the tension of the long resin film F to be fed to the first can roll 17. On the basis of this measured value, the difference between the circumferential speeds of the motor-driven first feeding roll 15 and first can roll 17, which are respectively located just upstream and downstream from the first feeding tension sensor roll 16, is adjusted. Similarly, the first sending tension sensor roll 18 provided just downstream from the first can roll 17 measures the tension of the long resin film F sent from the first can roll 17. On the basis of this measured value, the difference between the circumferential speeds of the motor-driven first can roll 17 and first sending roll 19, which are respectively located just upstream and downstream from the first sending tension sensor roll 18, is adjusted. A feeding and sending system constituted from the two driving rolls and the two tension sensor rolls located upstream and downstream from the first can roll 17 allows the long resin film F to stably come into close contact with the outer circumference of the first can roll 17.

The long resin film F sent from the first sending roll 19 passes through a free roll 30d, a free roll 30e, a central driving roll 20 located in almost the center of the roll-to-roll transfer path, and a free roll 30f, and then exits from the first film deposition chamber 10a and enters into the second film deposition chamber 10b. The long resin film F that has entered into the second film deposition chamber 10b is fed to the second can roll 23 through a free roll 30g and a free roll 30h while the feeding tension is adjusted by a second feeding roll 21 and a second feeding tension sensor roll 22 in the same manner as the above-described feeding and sending system for the first can roll 17.

The long resin film F is subjected to film deposition processing by the film deposition unit while being transferred clockwise along the outer circumference of the second can roll 23, then sent from the outer circumference of the second can roll 23 while the sending tension is adjusted by a second sending tension sensor roll 24 and a second sending roll 25, and then exists from the second film deposition chamber 10b through a free roll 30i and enters into the winding chamber 10c. The long resin film F that has entered into the winding chamber 10c passes through a free roll 30j, a pre-winding tension sensor roll 26, and a free roll 30k, and is then wound up by the winding roll 27 while the pre-winding tension is controlled on the basis of the tension measured by the pre-winding tension sensor roll 26.

As described above, by wrapping the long resin film F around the outer circumferences of the two continuously-provided can rolls in opposite directions, it is possible to bring the surface of the long resin film F, which is opposite to the surface in contact with the outer circumference of one of the two can rolls, into contact with the outer circumference of the other can roll. Further, first, second, third, and fourth magnetron sputtering cathodes 41, 42, 43, and 44 are provided in this order as dry film deposition units along the transfer path so as to face the outer circumference of the upstream first can roll 17, and fifth, sixth, seventh, and eighth magnetron sputtering cathodes 45, 46, 47, and 48 are provided in this order along the transfer path so as to face the outer circumference of the downstream second can roll 23. This makes it possible to perform film deposition on both surfaces of the long resin film by transferring the long resin film in a roll-to-roll manner only in one direction. It is to be noted that when such a plate-like target as shown in FIG. 1 is used, there is a case where nodules occur (due to the growth of foreign matter) on the target. If this becomes a problem, a cylindrical rotary target may be used which does not generate nodules and is high in its use efficiency.

In the vacuum film deposition device shown in FIG. 1, the downstream second can roll 23 has a gas release mechanism to release a gas from the outer circumference thereof. The gas release mechanism of the second can roll 23 will be described with reference to FIG. 2. The second can roll 23 is constituted from a metal cylindrical member 1 and has an outer circumference 1a as a transfer path around which the long resin film F is to be wrapped. In the inside of the cylindrical member 1, a so-called jacket roll structure 2 is provided which is configured to allow a temperature-controlled cooling medium, such as cooling water, to flow through a flow channel 2a. The cooling medium circulates between the flow channel 2a and a cooling medium cooling device (not shown) provided outside the vacuum chamber 10 through a rotary shaft 3 located along a center axis O of the cylindrical member 1 and having a double pipe structure. The rotary shaft 3 has bearings 3a provided on the outer circumference at both ends thereof so that the cylindrical member 1 can be rotatably supported.

The cylindrical member 1 has a thick outer circumferential portion. In the thick outer circumferential portion, a plurality of gas introduction channels 4 that extend along the center axis O are provided at regular intervals in the circumferential direction over the entire circumference. Each of the gas introduction channels 4 has a plurality of gas release holes 5 provided at regular intervals along the center axis O so as to open on the outer circumference 1a side. A gas rotary joint 6 is attached to one end of the cylindrical member 1 so that a gas can be dividedly supplied to the gas introduction channels 4 from a gas supply source (not shown) provided outside the vacuum chamber 10. This mechanism makes it possible to release a gas into the gap between the outer circumference of the second can roll 23 and the long resin film F wrapped around the second can roll 23 through the gas introduction channels 4 and the gas release holes 5 that communicate with the gas introduction channels 4, thereby improving the heat conductivity of the gap.

The number of the gas introduction channels 4 and the number of the gas release holes 5 provided in each of the gas introduction channels 4 can be appropriately determined according to the area of the long resin film F that covers the outer circumference of the second can roll 23, the tension of the long resin film F, the amount of a gas released into the gap, the capacity of vacuum pumps provided in the vacuum chamber 10, etc. The inner diameter of each of the gas release holes 5 is not particularly limited as long as a gas can be well introduced into the gap formed between the outer circumference of the second can roll 23 and the long resin film F wrapped around the second can roll 23. However, a plurality of gas release holes 5 having a very small inner diameter are preferably provided with a narrow pitch from the viewpoint of achieving uniform heat conductivity over the entire outer circumference of the second can roll 23.

If the gas release holes 5 have a large inner diameter, there is a case where, in the long resin film F wrapped around the second can roll 23, areas facing the gas release holes 5 and areas not facing the gas release holes 5 are different in cooling efficiency. For this reason, in general, the inner diameter is preferably about 30 μm to 1000 μm. However, it is technically difficult to provide a plurality of holes having a very small inner diameter with a narrow pitch. Practically, it is more preferred that small holes having an inner diameter of about 150 to 500 μm are provided with a 5- to 10-mm pitch in the outer circumference of the second can roll 23.

Hereinbelow, the gas rotary joint 6 that dividedly supplies a gas to the gas introduction channels 4 will be described. The gas rotary joint 6 includes a circular rotary ring unit 6a that is fixed to one end of the above-described cylindrical member 1 so as to rotate together with the cylindrical member 1 and an irrotational circular static ring unit 6b. The sliding surface of the circular rotary ring unit 6a and the sliding surface of the irrotational circular static ring unit 6b slide over each other. It is to be noted that a known gas sealing means is preferably provided to prevent gas leakage from between the sliding surfaces. The above-described rotary shaft 3 protrudes out of the center openings of these circular ring units 6a and 6b.

In the rotary ring unit 6a, gas distribution channels 7 are radially provided whose number is the same as the number of the gas introduction channels 4. These gas distribution channels 7 respectively communicate with the gas introduction channels 4 through connecting tubes 7a. It is to be noted that the number of the gas distribution channels 7 may be different from the number of the gas introduction channels 4. In this case, a collecting tube that collects every two or more adjacent gas introduction channels 4 together may be connected to each of the gas distribution channels 7 of the rotary ring unit 6a. The other end of each of the gas distribution channels 7 opposite to the end connected to the gas introduction channel 4 opens on the sliding surface that is in contact with the static ring unit 6b. On the other hand, one gas supply channel 8 is provided in the static ring unit 6b. One end of the gas supply channel 8 is connected to a gas supply tube 8a connected to the gas supply source (not shown) provided outside the vacuum chamber 10. The other end of the gas supply channel 8 opposite to the end connected to the gas supply tube 8a opens on the sliding surface in contact with the rotary ring unit 6a so as to face the ends of the gas distribution channels 7 that open on the sliding surface. This makes it possible to dividedly supply a gas to the gas introduction channels 4.

In part of the outer circumference of the second can roll 23 around which the long resin film F is not wrapped, that is, in the unwrapped region of the second can roll 23, the gas release holes 5 remain open in the vacuum chamber 10, and therefore it is preferred that a gas is not introduced into the gas introduction channels 4 located in the unwrapped portion. As a method for not supplying a gas into some of the gas introduction channels 4, a method may be used in which a valve is provided in each of the gas distribution channels 7 in the rotary ring unit 6a so as to be electrically or electromagnetically opened or closed depending on its angular position. Alternatively, a method may be used in which the valve is mechanically opened or closed using the rotation of the rotary ring unit 6a. Among them, the latter method is preferred because of its easiness. Specific examples of the latter method include a method in which not a circular open groove but an almost C-shaped open groove is formed in the sliding surface at the end of the gas supply channel 8 so that a gas is introduced into only the gas distribution channels 7 that communicate with the gas introduction channels 4 located in a region other than the unwrapped region, and a method in which the circular open groove is partially filled with a filling material 8b such as a Teflon packing as shown in FIG. 2.

By using the gas rotary joint 6 having such a structure as described above, the supply of a gas into the gas introduction channels 4 is blocked in the unwrapped region of the outer circumference of the second can roll 23 where the long resin film F is not wrapped, and therefore a gas is prevented from being wastefully released into the vacuum chamber 10 through the gas release holes 5. Therefore, an adverse effect on the control of the pressure in the vacuum chamber 10 can be reduced, and the pressure of a gas introduced into the gas introduction channels 4 can be stably maintained at a predetermined value. Further, since no electromagnetic valve or pneumatic valve is used, complicated wiring and piping does not need to be installed in the second can roll 23.

It is to be noted that the structure of the gas rotary joint 6 is not limited to one in which the sliding surface of the rotary ring unit 6a and the sliding surface of the static ring unit 6b, which are perpendicular to the center axes of these ring units, slide over each other as described above. For example, the gas rotary joint 6 may have a structure in which the outer circumference of a circular static ring unit having a small diameter is in sliding contact with the inner circumference of a circular rotary ring unit having a large diameter. In this case, one end of each gas distribution channel is opened on the inner circumference of the rotary ring unit, and an open groove of a gas supply channel is provided in the outer circumference of the static ring unit so as to extend in the circumferential direction only in the angular range corresponding to a region other than the unwrapped region. The gas rotary joint may be attached not only to the one end of the can roll but also to the other end of the can roll.

As described above, the gas pressure in the gap between the outer circumference of the second can roll 23 and the long resin film F wrapped around the second can roll 23 is preferably set so as not to exceed a normal force for pressing the long resin film F against the outer circumference of the second can roll 23. Therefore, the gas pressure in the gap is preferably controlled by a gas supplied from the gas supply source through the gas supply tube 8a. However, it is difficult to directly measure the gas pressure in the gap between the outer circumference of the second can roll 23 and the long resin film F wrapped around the second can roll 23.

Therefore, as shown in FIG. 3, a vacuum gauge P such as a diaphragm gauge may be provided in the gas supply channel 8 whose gas pressure is estimated to be almost the same as the gas pressure in the gap, in which case a piezo valve PV is operated by a control unit CPU to perform feedback control so that a value measured by the vacuum gauge P is equal to a preset value. In this case, cascade control may be performed using a pressure measured by the vacuum gauge P so that a gas supply flow rate measured by a mass flow meter MFM is constant. It is to be noted that the gas released into the gap is small in amount and therefore can be exhausted by the vacuum pumps provided in the vacuum chamber 10. When the gas introduced into the gap is the same as a gas used as a sputtering atmosphere, the sputtering atmosphere is not contaminated.

In the surface processing device described above as a specific example of the present invention, the gap between the outer circumference of at least one of at least two can rolls other than the can roll provided most upstream and a long base material wrapped round the can roll can be maintained almost constant by introducing a gas into the gap, and therefore a uniform heat conductance is achieved over the almost entire of the gap, and the temperature of the long base material can be maintained uniform during processing involving the application of a thermal load, such as preprocessing or film deposition. As a result, it is possible to prevent the occurrence of wrinkling in the long base material.

It is to be noted that the vacuum film deposition device shown in FIG. 1 is a device for performing sputtering film deposition processing on the long resin film F as processing involving the application of a thermal load, and therefore the magnetron sputtering cathodes 41 to 48 are provided as described above. However, the processing involving the application of a thermal load is not limited thereto, and a device for another surface processing such as CVD (chemical vapor deposition) or vacuum deposition may be used. In this case, surface processing units for such a device are provided instead of the plate-like targets. Hereinbelow, a method for producing a metallized resin film using the above-described vacuum film deposition device will be described.

(1) First, in a unwinding zone in the first film deposition chamber 10a, the long resin film F is unwound from the unwinding roll 11 while the tension of the long resin film F is controlled by controlling the rotation speeds of the tension sensor roll 12, the unwinding roll 11 located just upstream from the tension sensor roll 12, and the first driving roll 13 located just downstream from the tension sensor roll 12. In the first film deposition chamber, a drying zone having a reduced-pressure atmosphere may be provided, if necessary so that the unwound long resin film F is dried by allowing it to pass through the drying zone. In the drying zone, a carbon heater or the like may be provided to apply a thermal load to enhance a drying effect.

(2) Then, in a film deposition zone in the first film deposition chamber 10a, a film is formed on a first surface of the long resin film F using targets attached to the four magnetron sputtering cathodes 41 to 44 facing the outer circumference of the first can roll 17 while the long resin film F is wrapped around the outer circumference of the first can roll 17. At this time, the tension of the long resin film F measured by the feeding tension sensor roll 16 is controlled by the motor-driven feeding roll 15 to be a predetermined value on the upstream side from the first can roll 17, and the tension of the long resin film F measured by the sending tension sensor roll 18 is controlled by the motor-driven sending roll 19 to be a predetermined value on the downstream side from the first can roll 17.

(3) Tension cutting is performed by the motor-driven driving roll 20 so that the control of tension of the long resin film F at the downstream second can roll 23 is not affected by the control of tension of the long resin film F at the first can roll 17. Then, in a film deposition zone in the second film deposition chamber 10b, a film is formed on a second surface of the long resin film F using targets attached to the four magnetron sputtering cathodes 45 to 48 facing the outer circumference of the second can roll 23 while the long resin film F is wrapped around the second can roll 23. At this time, the tension of the long resin film F measured by the feeding tension sensor roll 22 is controlled by the motor-driven feeding roll 21 to be a predetermined value on the upstream side from the second can roll 23, and the tension of the long resin film F measured by the sending tension sensor roll 24 is controlled by the motor-driven sending roll 25 to be a predetermined value on the downstream side from the second can roll 23.

(4) Finally, in a winding zone in the winding chamber 10c, the tension of the long resin film F is measured by the tension sensor roll 26, and the long resin film F is wound up so that the measured tension is equal to a predetermined value. A near roll (not shown) may be provided upstream from the winding roll 27, which makes it possible to effectively reduce wrinkling during winding.

The above-described method makes it possible to produce, for example, a metallized long resin film in which a film made of an Ni-based alloy or the like and a Cu film are laminated on the surfaces of the long resin film F. The metallized resin film having such a laminated structure is formed into a flexible wiring substrate by patterning the metal film by a subtractive method. Here, the subtractive method is a method in which a flexible wiring substrate is produced by removing a metal film (e.g., the above-described Cu film) not covered with a resist by etching.

The above-described film made of an Ni alloy or the like is called a seed layer, and its composition is selected depending on desired properties of the metallized resin film such as electrical insulating properties and migration resistance. For example, various known alloys such as Ni—Cr alloys, Inconel, constantan, and monel can be used. When the metal film (Cu film) of the metallized long resin film produced by the dry film deposition needs to be further thickened, the thickness of the metal film may further be increased by a wet plating method. In this case, the metal film may be thickened by electroplating processing alone or a combination of electroless plating processing as primary plating and electrolytic plating processing as secondary plating. In either case, the wet plating method is not particularly limited, and a general wet plating method can be used.

Examples of a resin film that can be used for the metallized resin film include polyimide-based films, polyamide-based films, polyester-based films, polytetrafluoroethylene-based films, polyphenylene sulfide-based films, polyethylene naphthalate-based films, and liquid crystal polymer-based films. Among them, polyethylene terephthalate (PET) films and polyimide films are preferred from the viewpoint of flexibility required for a metallized flexible substrate, strength required for practical use, and electrical insulating properties suitable for a wiring material. It is to be noted that the above specific example has been described with reference to a case where a metal film made of a Ni—Cr alloy and a metal film made of Cu are laminated on a long resin film, but metal films to be formed are not limited thereto and may be an oxide film, a nitride film, a carbide film, and the like.

The vacuum film deposition device has been described above as a specific example of the roll-to-roll long base material processing device according to the present invention, but the long base material processing device according to the present invention is not limited thereto, and may be a device in which a long base material is subjected to processing involving the application of a thermal load, such as plasma processing or ion beam processing, in a vacuum chamber under a reduced-pressure atmosphere to modify the surface of the long base material. It is to be noted that plasma processing is processing in which a long base material is processed by, for example, oxygen plasma or nitrogen plasma generated by electric discharge in a mixed gas of argon and oxygen or a mixed gas of argon and nitrogen under a reduced-pressure atmosphere, and ion beam processing is processing in which plasma discharge is generated in a magnetic field gap to which a strong magnetic field is applied under a reduced-pressure atmosphere, and an object (long base material) is irradiated with ion beams generated by anodically electrolyzing positive ions in the plasma.

EXAMPLES

Film deposition was performed on both surfaces of a long resin film F with the use of the vacuum film deposition device (sputtering web coater) shown in FIG. 1. As the long resin film F, a PET film "COSMOSHINE (registered trademark)" having a width of 570 mm, a length of 1000 m, and a thickness of 50 μm and manufactured by Toyobo Co., Ltd. was used. Further, the two can rolls 17 and 23 were cylindrical members made of stainless steel, having a jacket roll structure, and having a diameter of 800 mm and a width of 800 mm, and their outer circumferences were plated with hard chromium. The second can roll 23 had 360 gas introduction channels 4 formed in the thick circumferential portion of the cylindrical member so as to have an inner diameter of 4 mm, and each of the gas introduction channels 4 had 47 gas release holes 5 formed so as to have an inner diameter of 0.2 mm at 10-mm intervals. It is to be noted that the gas release holes 5 were provided only in a region on the inside of positions located 20 mm inside of the both width-direction ends of a region of the outer circumference around which the long resin film F was to be wrapped.

When the long resin film F is wrapped around the gas release mechanism-equipped can roll during its transfer in the vacuum film deposition device, the angular range of the unwrapped region with which the long resin film F does not come into contact is about 90°. Therefore, the number of the gas introduction channels 4 located within the angular range of the unwrapped region is 90. For this reason, an almost C-shaped groove was provided in the sliding surface of the static ring unit 6b of the gas rotary joint 6, which is in contact with the sliding surface of the rotary ring unit 6a, at the end of the gas supply channel 8 so as to open only in the angular range of an about 270-degree wrapped region except for the about 90-degree unwrapped region.

Due to manufacturing reasons, it was difficult to connect the 360 gas introduction channels 4 to the gas distribution channels 7 of the rotary ring unit 6a of the gas rotary joint 6 on a one-to-one basis. Therefore, a gas collecting tube that collected every 10 gas introduction channels 4 together was connected to each of the gas distribution channels 7. That is, 36 gas collecting tubes were connected to the rotary joint 6. Further, a pressure gauge (trade name: Baratron vacuum gauge) was attached to the gas supply channel 8 of the static ring unit 6b to control the pressure in the gap.

In order to form, as metal films, an Ni—Cr film as a seed layer on the PET film (resin film) and a Cu film on the seed layer, Ni—Cr targets were placed at the first magnetron sputtering cathode 41 provided around the first can roll 17 and the fifth magnetron sputtering cathode 45 provided around the second can roll 23, and Cu targets were placed at the other magnetron sputtering cathodes. It is to be noted that even when the transfer speed is changed, a 30 nm-thick Ni—Cr layer and a 90 nm-thick Cu layer can be formed by adjusting the input power of these sputtering cathodes.

The PET film was loaded on the unwinding roll 11, and its leading end was drawn and attached to the winding roll 27 through the first can roll 17 and the second can roll 23. The tension of the PET film unwound from the unwinding roll 11 and wound up on the winding roll 27 was set to 100 N, and the tension of the PET film before and after the first can roll 17 and the tension of the PET film before and after the second can roll 23 were both set to 200 N. Cooling water controlled at 0° C. on the outside of the vacuum chamber 10 was circulated in the first can roll 17 and the second can roll 23. Further, argon gas was introduced at 300 sccm, and power applied to each of the cathodes was controlled to be 20 kW to perform film deposition.

In such a state, the vacuum chamber 10 was evacuated to 5 Pa using two or more dry pumps, and then evacuated to $3\times10^{-3}$ Pa using two or more turbomolecular pumps and cryocoils, and then the transfer of the long resin film F was started. After the start of the transfer, the flow rate of a gas supplied to the gas rotary joint 6 was controlled so that a pressure measured by the pressure gauge attached to the gas rotary joint 6 of the second can roll 23 was 800 Pa while the transfer speed was variously changed. The long resin film F was visually observed through an observation window to determine whether or not wrinkling occurred during film deposition on the first can roll 17. After the completion of film deposition, the long resin film F having films on both surfaces thereof was removed from the winding roll 27 and visually observed to determine whether or not wrinkling caused by a thermal load during sputtering had occurred. The results are shown in the following Table 1.

TABLE 1

| | Ni—Cr | | Presence or absence of occurrence of wrinkling | | |
|---|---|---|---|---|---|
| Transfer | film | Cu | First can roll | Second can roll | |
| speed (m/min) | thickness (nm) | thickness (nm) | without gas release | without gas release | with gas release |
| 1 | 30 | 90 | Absent | Absent | Absent |
| 2 | 30 | 90 | Absent | Absent | Absent |
| 3 | 30 | 90 | Absent | Absent | Absent |
| 4 | 30 | 90 | Absent | Absent | Absent |
| 5 | 30 | 90 | Absent | Present | Absent |
| 6 | 30 | 90 | Absent | Present | Absent |
| 7 | 30 | 90 | Absent | Present | Absent |
| 8 | 30 | 90 | Absent | Present | Absent |
| 9 | 30 | 90 | Absent | Present | Absent |
| 10 | 30 | 90 | Present | Present | Present |
| 11 | 30 | 90 | Present | Present | Present |
| 12 | 30 | 90 | Present | Present | Present |

As can be seen from Table 1, when film deposition was performed on both surfaces without using the gas release mechanism-equipped can roll as either of the first and second can rolls 17 and 23, wrinkling occurred in the long resin film F due to the application of a thermal load during film deposition when the transfer speed of the long resin film F was 5 m/min or more. On the other hand, when film deposition was performed on both surfaces using the gas release mechanism-equipped can roll as the second can roll 23, wrinkling did not occur even when the transfer speed was increased to 9 m/min. The reason why wrinkling is likely to occur during film deposition when the transfer speed is higher is that the speed of sputtering film deposition needs to increase to make the film thicknesses of the Ni—Cr layer and the Cu layer uniform even when the transfer speed increases, and therefore the input power for sputtering needs to increase so that a thermal load caused by sputtering increases and exceeds the cooling capacity of each of the can rolls.

REFERENCE SINGS LIST

1 Cylindrical member
2 Jacket roll structure
3 Rotary shaft
3a Bearing
4 Gas introduction channel
5 Gas release hole
6 Gas rotary joint
7 Rotary ring unit
8 Static ring unit
7a Gas distribution channel
8a Gas supply channel
9 Gas supply tube
10 Vacuum chamber
11 Unwinding roll
12 First tension sensor roll
13 First driving roll
14 Second tension sensor roll
15 First feeding roll
16 First feeding tension sensor roll
17 First can roll
18 First sending tension sensor roll
19 First sending roll
20 Central driving roll
21 Second feeding roll
22 Second feeding tension sensor roll
23 Second can roll
24 Second sending tension sensor roll
25 Second sending roll
26 Pre-winding tension sensor roll
27 Winding roll
30a, 30b, 30c, 30d, 30e, 30f, 30g, 30h, 30i, 30j, 30k Free rolls
41, 42, 43, 44, 45, 46, 47, 48 Magnetron sputtering cathodes
PV Piezo valve
MFM Mass flow meter
P Pressure sensor (Pressure detecting unit)
CPU Controller
F Long resin film

The invention claimed is:

1. A roll-to-roll surface processing device comprising: at least two can rolls that cool a base material transferred in a roll-to-roll manner in a vacuum chamber with a cooling medium circulating therein by wrapping the base material around outer circumferences thereof; and surface processing units provided so as to face the outer circumferences of the at least two can rolls, wherein
at least one of the at least two can rolls other than the can roll provided most upstream has a gas release mechanism that releases a gas from the outer circumference, and wherein a motor-driven driving roll for tension cut is provided between the can roll provided most upstream and a can roll that follows the can roll provided most upstream.

2. The roll-to-roll surface processing device according to claim 1, wherein at least one can roll having the gas release mechanism has a plurality of gas introduction channels provided in a outer circumferential portion thereof at regular intervals in a circumferential direction over an entire circumference so as to extend in a rotary shaft direction, and each of the gas introduction channels has a plurality of gas release holes provided at regular intervals in the rotary shaft direction so as to open on an outer circumference side and has a mechanism that stops release of a gas when located in an unwrapped portion of the outer circumference of at least one can roll around which the base material is not wrapped.

3. A roll-to-roll film deposition device comprising the roll-to-roll surface processing device according to claim 1, wherein the surface processing units are dry film deposition units.

4. The roll-to-roll film deposition device according to claim 3, wherein the dry film deposition units are sputtering cathodes.

5. A roll-to-roll film deposition device comprising the roll-to-roll surface processing device according to claim 2, wherein the surface processing units are dry film deposition units.

6. The roll-to-roll film deposition device according to claim 5, wherein the dry film deposition units are sputtering cathodes.

7. A roll-to-roll surface processing method comprising performing surface processing on a base material transferred in a roll-to-roll manner in a vacuum chamber while the base material is cooled by being wrapped around outer circumferences of at least two can rolls, in which a cooling medium is circulated, with use of surface processing units provided so as to face the outer circumferences, wherein
when the surface processing is performed, a gas is released from the outer circumference of at least one of the at least two can rolls other than the can roll provided most upstream,
and wherein a motor-driven driving roll for tension cut is provided between the can roll provided most upstream and a can roll that follows the can roll provided most upstream.

8. The roll-to-roll surface processing method according to claim 7, wherein the surface processing involves application of a thermal load, at least one can roll that releases a gas from the outer circumference thereof has a plurality of gas introduction channels provided in a thick outer circumferential portion thereof at regular intervals in a circumferential direction over an entire circumference so as to extend in a rotary shaft direction, and each of the gas introduction channels has a plurality of gas release holes provided at regular intervals in the rotary shaft direction so as to open on an outer circumference side and has a mechanism that stops release of the gas when located in an unwrapped portion of the outer circumference of the can roll around which the base material is not wrapped.

9. A roll-to-roll film deposition method using the roll-to-roll surface processing method according to claim 7, wherein the surface processing is dry film deposition processing.

10. The roll-to-roll film deposition method according to claim 9, wherein the dry film deposition processing is sputtering film deposition.

11. A roll-to-roll film deposition method using the roll-to-roll surface processing method according to claim 8, wherein the surface processing is dry film deposition processing.

12. The roll-to-roll film deposition method according to claim 11, wherein the dry film deposition processing is sputtering film deposition.

* * * * *